US011948631B2

(12) United States Patent
Na et al.

(10) Patent No.: US 11,948,631 B2
(45) Date of Patent: Apr. 2, 2024

(54) MEMORY DEVICE AND OPERATING METHOD THEREOF

(71) Applicant: SAMSUNG ELECTRONICS CO., LTD., Suwon-si (KR)

(72) Inventors: Tae Hui Na, Seoul (KR); Mu Hui Park, Hwaseong-si (KR); Kwang Jin Lee, Hwaseong-si (KR); Yong Jun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 17/314,161

(22) Filed: May 7, 2021

(65) Prior Publication Data

US 2021/0264975 A1 Aug. 26, 2021

Related U.S. Application Data

(62) Division of application No. 16/034,921, filed on Jul. 13, 2018.

(30) Foreign Application Priority Data

Nov. 27, 2017 (KR) .................. 10-2017-0159312

(51) Int. Cl.
G11C 11/00 (2006.01)
G11C 13/00 (2006.01)
H10N 70/20 (2023.01)

(52) U.S. Cl.
CPC ........ G11C 13/0004 (2013.01); G11C 13/004 (2013.01); H10N 70/231 (2023.02);
(Continued)

(58) Field of Classification Search
CPC .............. G11C 13/0004; G11C 13/004; G11C 2013/0057; G11C 2013/72
(Continued)

(56) References Cited

U.S. PATENT DOCUMENTS 7,646,633 B2 1/2010 Fuji
8,194,441 B2 6/2012 Thiruvengadam
(Continued)

FOREIGN PATENT DOCUMENTS

CN 1377503 10/2002
CN 101004948 7/2007
(Continued)

OTHER PUBLICATIONS

Office Action issued in corresponding Chinese patent application No. CN 201811311090.0 dated Feb. 28, 2023.
(Continued)

*Primary Examiner* — Vu A Le
(74) *Attorney, Agent, or Firm* — F. Chau & Associates, LLC

(57) ABSTRACT

A memory device includes a memory cell array including a plurality of memory cells, each of the plurality of memory cells having a switch element, and a data storage element connected to the switch element and containing a phis change material; and a memory controller for obtaining first read voltages from the plurality of memory cells, inputting a first write current to the plurality of memory cells, and then, obtaining second read voltages from the plurality of memory cells, wherein the memory controller compares the first read voltage of a first memory cell of the plurality of memory cells to the second read voltage of the first memory cell to determine a state of the first memory cell.

11 Claims, 18 Drawing Sheets

(52) U.S. Cl.
CPC .. *G11C 2013/0057* (2013.01); *G11C 2213/72* (2013.01); *G11C 2213/76* (2013.01)

(58) Field of Classification Search
USPC .......................................................... 365/148
See application file for complete search history.

(56) References Cited

U.S. PATENT DOCUMENTS

| | | | |
|---|---|---|---|
| 8,467,237 | B2 | 6/2013 | Bedeschi et al. |
| 9,142,271 | B1 | 9/2015 | Srinivasan et al. |
| 9,349,444 | B2 | 5/2016 | Patapoutian et al. |
| 9,349,447 | B1 | 5/2016 | Trent et al. |
| 9,627,055 | B1 | 4/2017 | Robustelli |
| 9,672,908 | B2 | 6/2017 | Tortorelli et al. |
| 9,685,227 | B2 | 6/2017 | Lee et al. |
| 10,446,220 | B1 * | 10/2019 | Guo .................... G11C 11/2253 |
| 11,145,337 | B1 * | 10/2021 | Akaogi .................... G11C 7/12 |
| 2002/0126525 | A1 | 9/2002 | Weber et al. |
| 2002/0131296 | A1 | 9/2002 | Hirai |
| 2004/0022085 | A1 | 2/2004 | Parkinson et al. |
| 2004/0076029 | A1 | 4/2004 | Jeong |
| 2005/0195644 | A1 | 9/2005 | Ikegawa et al. |
| 2007/0133269 | A1 | 6/2007 | Lee et al. |
| 2007/0211524 | A1 | 9/2007 | Kurisu |
| 2008/0055972 | A1 | 3/2008 | Oh et al. |
| 2009/0201714 | A1 | 8/2009 | Hoenigschmid |
| 2010/0080054 | A1 | 4/2010 | Abe |
| 2010/0321987 | A1 | 12/2010 | Lung et al. |
| 2011/0122684 | A1 | 5/2011 | Sheu et al. |
| 2013/0229861 | A1 | 9/2013 | Ueda |
| 2013/0272060 | A1 | 10/2013 | Andre et al. |
| 2015/0063004 | A1 | 3/2015 | Sutardja et al. |
| 2015/0294716 | A1 | 10/2015 | Tortorelli et al. |
| 2017/0117328 | A1 | 4/2017 | Terai |
| 2017/0186486 | A1 | 6/2017 | Mantegazza et al. |
| 2018/0277187 | A1 | 9/2018 | Ikegami et al. |
| 2019/0164601 | A1 | 5/2019 | Na et al. |

FOREIGN PATENT DOCUMENTS

| | | |
|---|---|---|
| CN | 101930793 | 12/2010 |
| CN | 104380384 | 2/2015 |
| CN | 107017276 | 8/2017 |
| JP | 2003-510752 | 3/2003 |
| JP | 2004-134057 | 4/2004 |
| JP | 2010-80009 | 4/2010 |
| JP | 2017-85103 | 5/2017 |
| JP | 2018156556 | 10/2018 |
| JP | 2002-269968 | 9/2020 |
| JP | 2007-242118 | 9/2020 |

OTHER PUBLICATIONS

Japanese Office Action issued in corresponding JP application No. 2018-186435 dated Mar. 8, 2022.
Search Report and Written Opinion issued in corresponding Singapore patent Application No. 10201808767W dated Apr. 9, 2019.
Korean Office Action issued in corresponding Korean Patent Application No. 10-2017-0159312 dated Mar. 29, 2021.
H. Tanizaki et al., "A high-density and high-speed 1T-4MTJ Mram with Voltage Offset Self-Reference Sensing Scheme", 2006 IEEE Asian Solid-State Circuits Conference, 2006, pp. 303-306.
German Office Action issued in corresponding German Patent Application No. 102018124093.7 dated Mar. 25, 2021.
Korean Notice of Allowance issued in corresponding Korean Patent Application No. 10-2017-0159312 dated Aug. 10, 2021.

* cited by examiner

MEMORY DEVICE AND OPERATING METHOD THEREOF

CROSS-REFERENCE TO RELATED APPLICATIONS

This application is a Divisional of U.S. Patent application Ser. No. 16/034,921 filed on Jul. 13, 2018, which claims priority under 35 U.S.C. § 119 to Korean Patent Application No. 10-2017-0159312, filed on Nov. 27, 2017 in the Korean Intellectual Property Office, the disclosures of which are incorporated by reference herein in then entireties.

1. TECHNICAL FIELD

The present inventive concept relates to a memory device and an operating method thereof.

2. DESCRIPTION OF RELATED ART

As demand for low power consuming and highly integrated memory devices increases, research into various types of next-generation memory devices is being conducted. One example next-veneration memory device that is being studied may store and delete data by adjusting a level of resistance applied to a data storage element with phase-change properties.

SUMMARY

According to an exemplary embodiment of the present inventive concept, a memory device may include: a memory cell array including a plurality of memory cells, each of the plurality of memory cells having a switch element, and a data storage element connected to the switch element and containing a phase-change material; and a memory controller for obtaining first read voltages from the plurality of memory cells, inputting a first write current to the plurality of memory cells, and then, obtaining second read voltages from the plurality of memory cells, wherein the memory controller compares the first read voltage of a first memory cell of the plurality of memory cells to the second read voltage of the first memory cell to determine a state of the first memory cell.

According to an exemplary embodiment of the present inventive concept, a memory device may include: a memory cell array including a plurality of memory cells, each of the plurality of memory cells having a switch element, and a data storage element, connected to the switch element and containing a phase-change material; and a memory controller for inputting a read current to the plurality of memory cells, sequentially detecting first read voltages and second read voltages from the plurality of memory cells, and comparing the first read voltage of a first memory cell of the plurality of memory cells to the second read voltage of the first memory cell to determine a state of the first memory cell.

According to an exemplary embodiment of the present inventive concept, a memory device may include: a memory cell having a switch element, and a data storage element connected to the switch element and containing a phase-change material; and a memory controller for sequentially detecting a first read voltage and a second read voltage from the memory cell, and comparing the first read voltage to the second read voltage to determine a state of the memory cell as a set state or a reset state, wherein, when the state of the memory cell is determined as the set state, the memory controller inputs, to the memory cell, a set write current for setting the state of the memory cell as the set state.

According to an exemplary embodiment of the present inventive concept, a method of operating a memory device may include: acquiring a first read voltage from each of a plurality of memory cells; acquiring a second read voltage from each of the plurality of memory cells; comparing, for each of the plurality of memory cells, its first read voltage to its second read voltage to determine a state of the memory cell as a set state or a reset state; and inputting a set write current to set the states of the plurality of memory cells as the set state to a portion of the plurality of memory cells determined to be in the set state.

BRIEF DESCRIPTION OF THE DRAWINGS

The above, and other features of the present inventive concept will be more clearly understood by describing in detail exemplary embodiments thereof with reference to the accompanying drawings, in which.

DETAILED DESCRIPTION OF THE EMBODIMENTS

Figure 1:
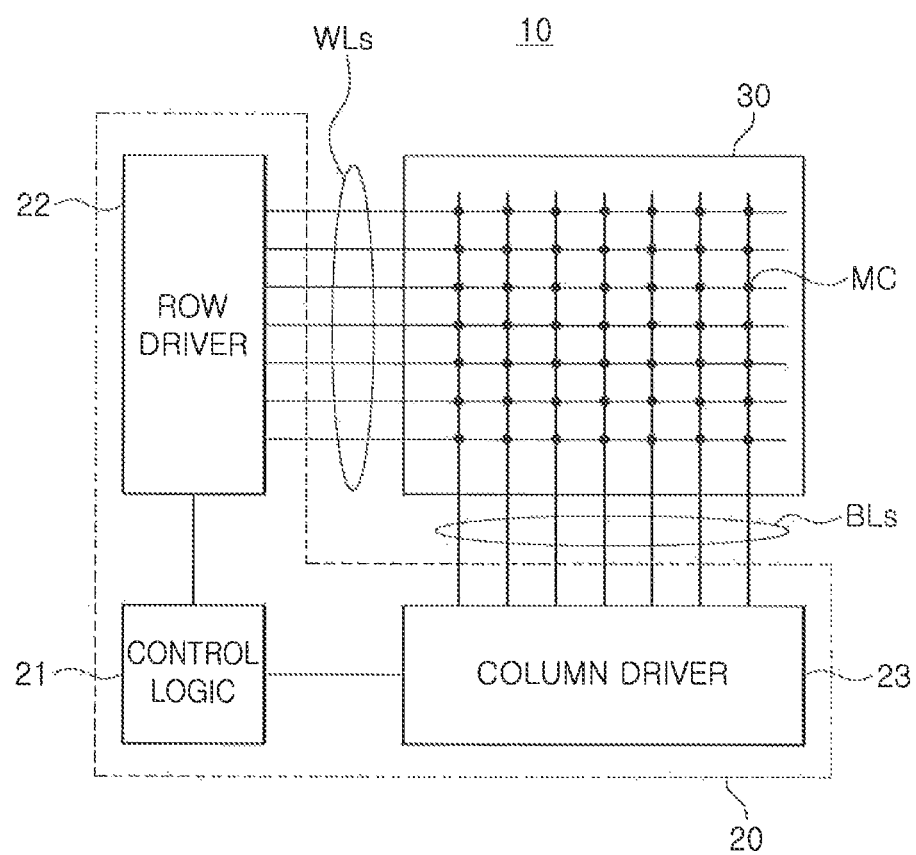
FIG. 1 is a block diagram schematically illustrating a memory device, according to an exemplary embodiment of the present inventive concept.

Exemplary embodiments of the present inventive concept will be described hereinafter, with reference to the accompanying drawings. In the drawings, like reference numerals may refer to like elements.

Figure 2:
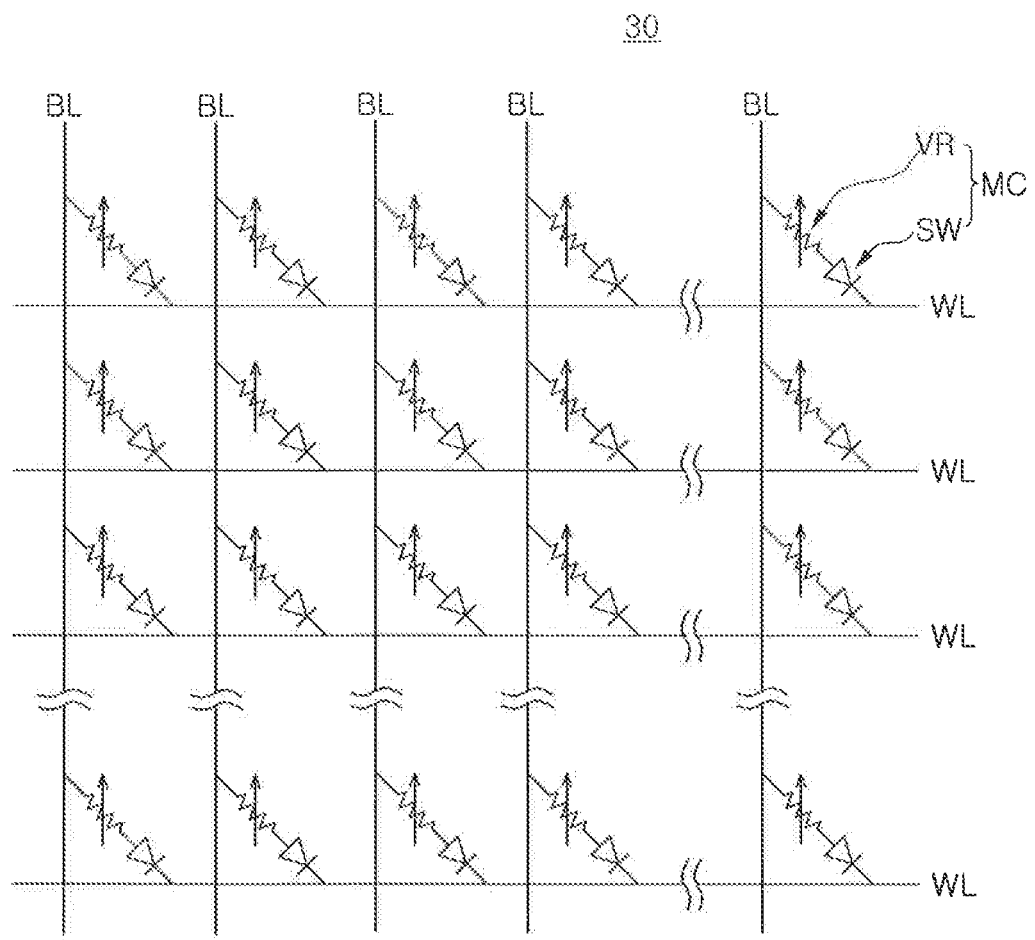
FIG. 2 is a circuit diagram of a memory cell array included in a memory device, according to an exemplary embodiment of the present inventive concept.

FIG. 1 is a block diagram schematically illustrating a memory device, according to an exemplary embodiment of the present inventive concept. FIG. 2 is a circuit diagram of a memory cell array included in a memory device, according to an exemplary embodiment of the present inventive concept.

Referring to FIG. 1, a memory device 10, according to an exemplary embodiment of the present inventive concept, may include a memory controller 20 and a memory cell array 30. The memory controller 20 may include a control logic 21, a row driver 22, and a column driver 23. The memory cell array 30 may include a plurality of memory cells MCs.

In an exemplary embodiment of the present inventive concept, the row driver 22 may be connected to the memory cells MCs through word lines WLs, and the column driver 23 may be connected to the memory cells MCs through bit lines BLs. In an exemplary embodiment of the present inventive concept, the row driver 22 may include an address decoder circuit for selecting a memory cell MC on which data is to be written or from which data is to be read. In addition, the column driver 23 may include a read or write circuit for writing data to a memory cell MC or reading data from the memory cell MC. Operations of the row driver 22 and the column driver 23 may be controlled by the control logic 21.

Referring to FIG. 2, the memory cell array 30, according to an exemplary embodiment of the present inventive concept, may include a plurality of memory cells MCs. Each of the memory cells MCs may be provided at points at which a plurality of word lines WLs and a plurality of bit lines BLs intersect each other. For example, each memory cell MC may be connected to a single word line WL and a single bit line BL.

Each memory cell MC may include a switch element SW and a data storage element VR. In an exemplary embodiment of the present inventive concept, the switch element SW may include a p-n diode, a Schottky diode, or an ovonic threshold switch (OTS). In an exemplary embodiment of the present inventive concept, the data storage element VR may be formed of a phase-change material having a chalcogenide material or a superlattice. For example, the data storage element VR may include a phase-change material, which can be phase-changed into an amorphous phase or a crystalline phase, according to heating times and heating temperatures.

The memory controller 20 may write or erase data by phase-changing the phase-change material of the data storage element VR included in each memory cell MC into the amorphous or crystalline phase. For example, the memory controller 20 may write or erase data in each memory cell MC through the word lines WLs and the bit lines BLs. In an exemplary embodiment of the present inventive concept, the memory controller 20 may increase a level of resistance applied to the data storage element VR to phase-change the phase-change material of the data storage element VR included in the memory cell MC into the amorphous phase. When the memory cell MC is the amorphous phase, the memory controller 20 may write data to the memory cell MC. In addition, the memory controller 20 may decrease the level of resistance applied to the data storage element VR by phase-changing the phase-change material of the data storage element VR included in the memory cell MC into the crystalline phase. In this case, the memory controller 20 may erase data from the memory cell MC.

Figure 3:
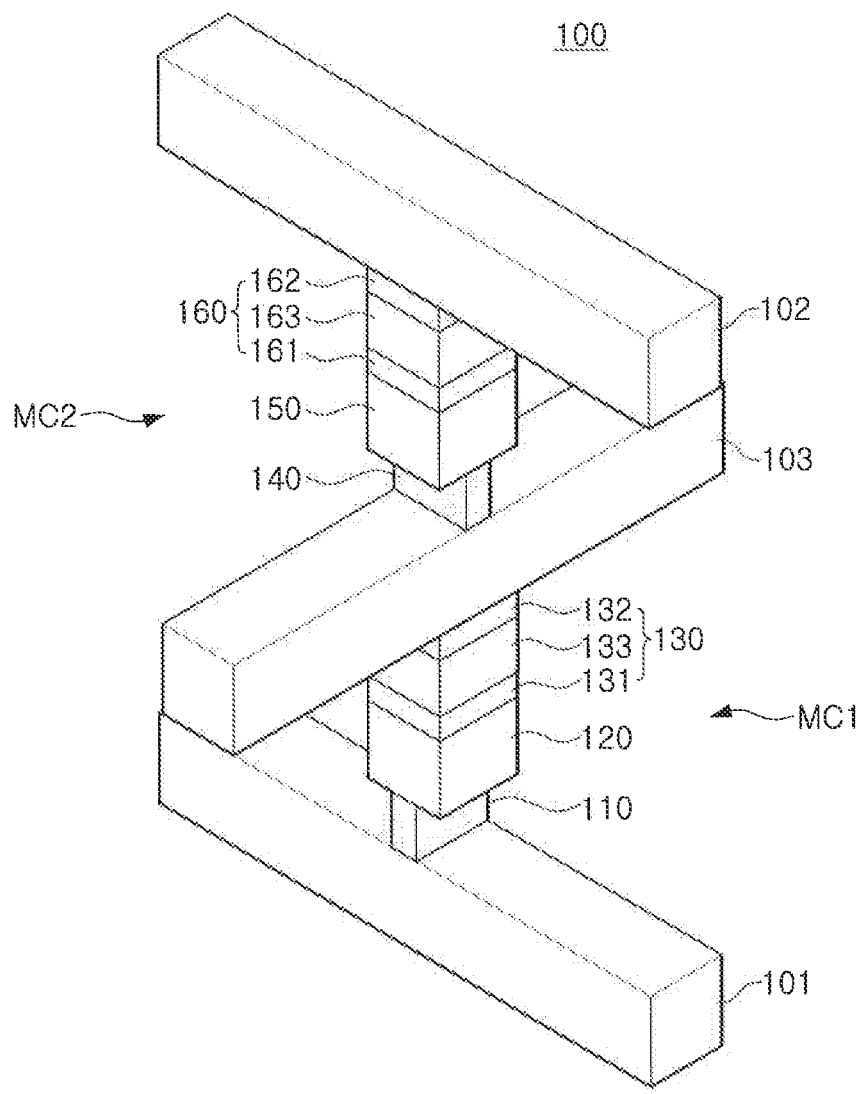
FIG. 3 is a perspective view schematically illustrating the structure of a memory cell included in a memory device, according to an exemplary embodiment of the present inventive concept.

FIG. 3 is a perspective view schematically illustrating the structure of a memory cell included in a memory device, according to an exemplary embodiment of the present inventive concept.

Referring to FIG. 3, a memory cell 100 included in a memory device, according to an exemplary embodiment of the present inventive concept, may include a first memory region mc1 provided between a first word line 101 and a bit line 103, and a second memory region mc2 provided between a second word line 102 and the bit line 103. The first memory region mc1 and the second memory region mc2 may operate as independent memory cells.

The first memory region mc1 may include a first heating electrode 110, a first data storage element 120, and a first switch element 130. The first switch element 130 may include a first switch electrode 131, a second switch electrode 132, and a first select layer 133 disposed therebetween. In an exemplary embodiment of the present inventive concept, the first select layer 133 may include an OTS material. When a voltage having a higher level than a threshold voltage is applied to the first select layer 133 between the first switch electrode 131 and the second switch electrode 132, a current may flow through the first select layer 133.

The first data storage element 120 may include a phase-change material, for example, a chalcogenide material. For example, the first data storage element 120 may include Ge—Sb—Te (GST). A crystallization temperature, a melting point, and a crystallization energy-dependent phase-change rate of the first data storage element 120 may be determined, according to types and chemical compositions of elements included in the first data storage element 120.

The second memory region mc2 may have a structure similar to that of the first memory region mc1. Referring to FIG. 3, the second memory region mc2 may include a second heating electrode 140, a second data storage element 150, and a second switch element 160. The second switch element 160 includes a third switch electrode 161, a fourth switch electrode 162, and a second select layer 163 disposed therebetween. A structure and characteristics of each of the second heating electrode 140, the second data storage element 150, and the second switch element 160 may be similar to the first heating electrode 110, the first data storage element 120, and the first switch element 130, respectively. A method of writing and erasing data will be described hereinafter, by referring to, for example, the first memory region mc1.

When a voltage is supplied through the first word line 101 and the bit line 103, Joule heat may be generated at an interface between the first heating electrode 110 and the first data storage element 120. The Joule heat may depend on the level of the supplied voltage. The joule heat may change the phase-change material of the first data storage element 120 from an amorphous phase to a crystalline phase, or from a crystalline phase to an amorphous phase. The first data storage element 120 may have a high level of resistance in the amorphous phase, and a low level of resistance in the crystalline phase. In an exemplary embodiment of the present inventive concept, data "0" or "1" may be defined, according to a resistance value of the first data storage element 120.

To write data in the first memory region mc1, a program voltage may be supplied through the first word line 101 and the bit line 103. The program voltage may have a higher level than a threshold voltage of the OTS material included in the first switch element 130, and thus, a level of current may flow through the first switch element 130. The program voltage may allow the phase-change material included in the first data storage element 120 to change from the amorphous phase to the crystalline phase, and thus, data may be written in the first memory region mc1. In an exemplary embodiment of the present inventive concept, a case in which the phase-change material included in the first data storage element 120 has the crystalline phase may be referred to as a set state.

To erase data written in the first memory region mc1, the phase-change material included in the first data storage element 120 may be changed from the crystalline phase to the amorphous phase. For example, an erase voltage may be supplied through the first word line 101 and the bit line 103. The erase voltage may cause the phase-change material included in the first data storage element 120 from transition from the crystalline phase to the amorphous phase. To cause this phase change, an erase value having a maximum value greater than that of the program voltage may be supplied, and an amount of time during which the erase voltage is supplied may be less than that of time during which the program voltage may be supplied.

Figure 4:
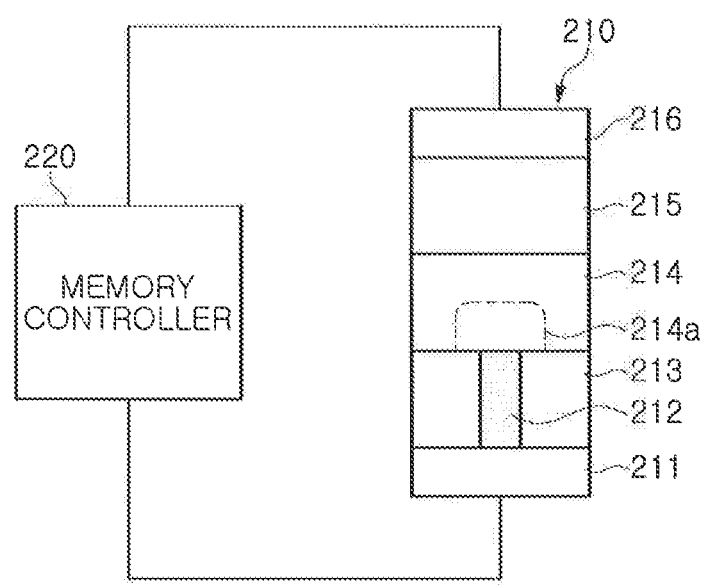
FIGS. 4, 5A, and 5B are drawings illustrating operations of a memory device, according to an exemplary embodiment of the present inventive concept.
Figure 5A:
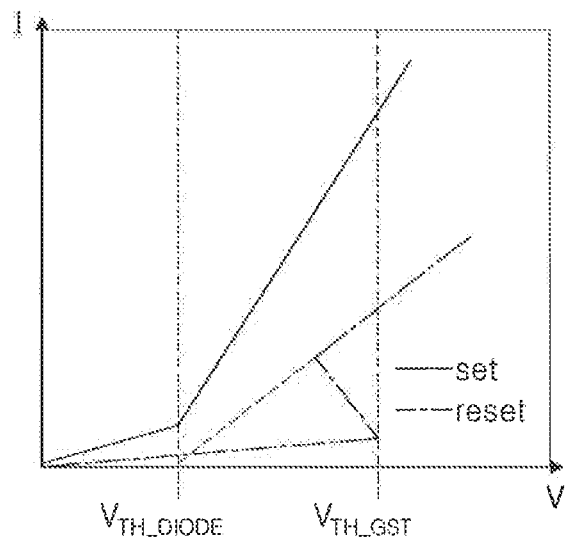
Figure 5B:
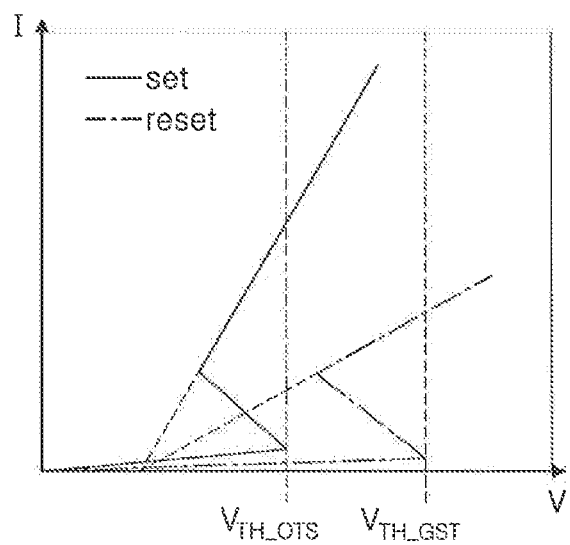

As described above, resistance values of the first and second data storage devices 120 and 150 may be changed, depending on states of the phase-change materials included in the first and second data storage devices 120 and 150. In addition, a memory controller may identify data "0" or "1" from the resistance values of the first and second data storage devices 120 and 150. Thus, as a difference between the resistance values of the first and second data storage devices 120 and 150 increases due to the changing states of the phase-change materials included in the first and second data storage devices 120 and 150, the memory controller may correctly write or read data. FIGS. 4, 5A, and 5B are drawings illustrating operations of a memory device, according to an exemplary embodiment of the present inventive concept.

The memory device, according to an exemplary embodiment of the present inventive concept, may be operated by power supplied to a memory cell 210 by a memory controller 220. Referring to FIG. 4, the memory controller 220 may input a current or voltage to the memory cell 210 to store data in the memory cell 210 or read data stored in the memory cell 210.

The memory cell 210 may include a lower electrode 211, a heating electrode 212, a data storage element 214, a switch element 215, and an upper electrode 216. The lower electrode 211 and the upper electrode 216 of the memory cell 210 may receive an amount of current or voltage through a word line or a bit line. An insulating layer 213 may be provided around the heating electrode 212, and a phase change may occur in a portion 214a of the data storage element 214 adjacent to the heating electrode 212. This way, a resistance value of the memory cell 210 may be changed. The memory controller 220 may store data in the memory cell 210 by increasing or decreasing the resistance value of the memory cell 210, using the phase change that can occur in the data storage element 214.

In an exemplary embodiment of the present inventive concept, the memory controller 220 may supply an amount of read current to the memory cell 210 to read the resistance value of the memory cell 210. The memory controller 220 may measure a read voltage while inputting the read current to the memory cell 210, and may compare the read voltage with a reference voltage level to determine data stored in the memory cell 210.

FIGS. 5A and 5B are graphs illustrating the current-voltage characteristics of a memory cell (MC), according to states of a data storage device. FIG. 5A illustrates an exemplary embodiment of the present inventive concept in which the memory cell (MC) has a switch element implemented as a diode. FIG. 5B illustrates an exemplary embodiment of the present inventive concept in which the memory cell (MC) has a switch element implemented as an OTS device. In the exemplary embodiments described with reference to FIGS. 5A and 5B, a set state may correspond to a case in which the data storage element is in a crystalline state, and a reset state may correspond to a case in which the data storage element is in an amorphous state.

Referring to FIG. 5A, when the memory cell (MC) that has the diode as the switch element is in the reset state, and a level of voltage applied to the memory cell (MC) is higher than that of a threshold voltage $V_{TH\_GST}$ of the data storage device, a snap back phenomenon may occur. Still referring to FIG. 5A, when the memory cell (MC) is in the set state, the snap back phenomenon, which is due to an increase in the voltage applied to the memory cell (MC), may not occur.

Referring to FIG. 5B, when the memory cell (MC) that has the OTS device as the switch element is in the reset state, and a level of voltage applied to the memory cell (MC) is higher than that of the threshold voltage $V_{TH\_GST}$ of the data storage device, the snap back phenomenon may occur. As further illustrated in FIG. 5B, even when the memory cell (MC) is in the set state, the snap back phenomenon may occur. Referring to FIG. 5B, when the memory cell (MC) is in the set state, the snap back phenomenon may occur when the level of voltage applied to the memory cell (MC) is higher than that of threshold voltage $V_{TH\_OTS}$ of the switch device.

Thus, when the memory cell (MC) has the OTS device as the switch device, the snap back phenomenon may occur when reading data from the memory cell (MC) in the set state. The snap back phenomenon, which occurs in the reading operation, may cause a phase change in the data storage element included in the memory cell (MC) in the set state, thereby increasing a resistance value of the data storage device. In other words, the snap back phenomenon, which occurs in the reading operation, may increase a resistance value of the memory cell (MC) in the set state, and thus, result in a reduction in a sensing margin of the memory cell (MC). Thus, the operating characteristics of a memory device may be degraded.

Figure 6:
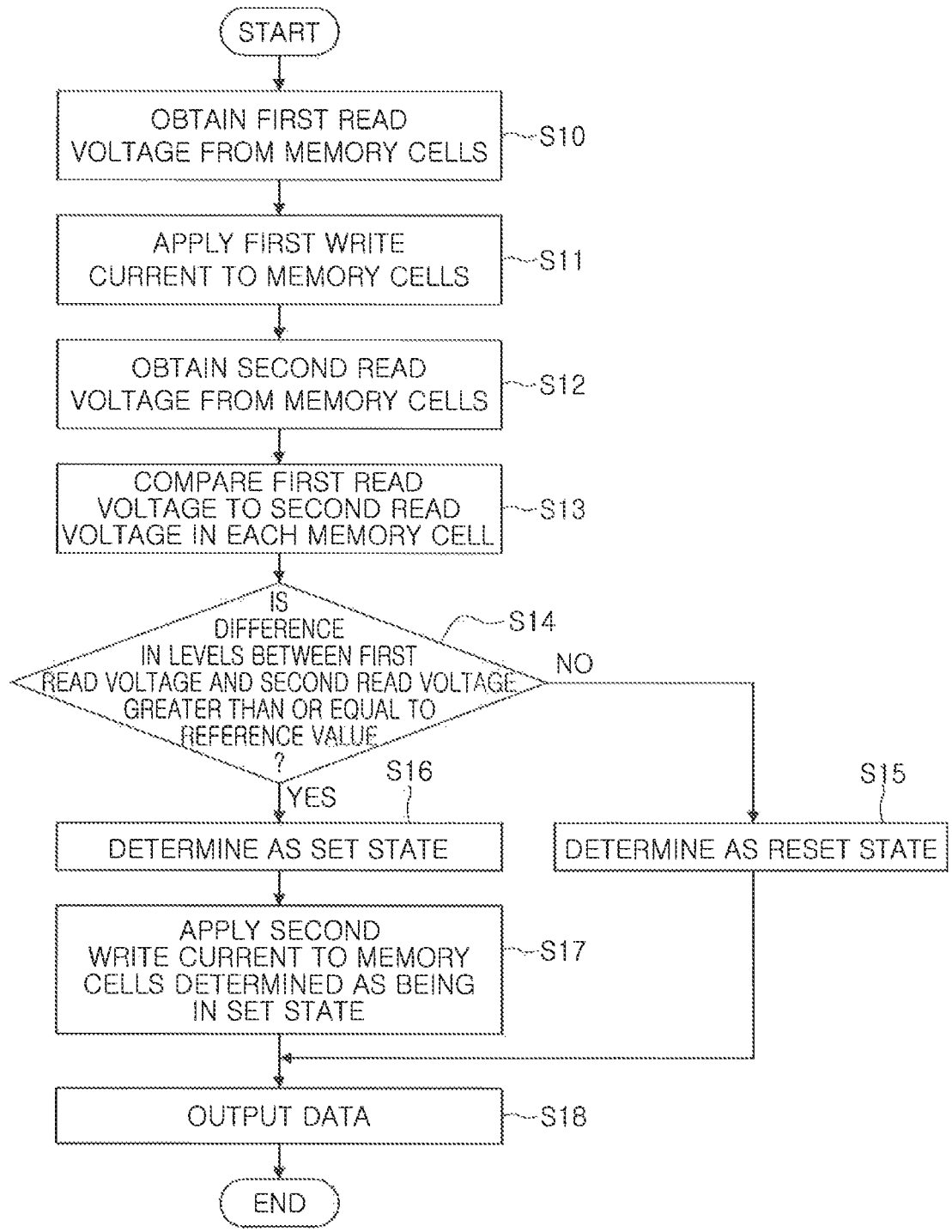
FIG. 6 is a flowchart illustrating operations of a memory device, according to an exemplary embodiment of the present inventive concept.

FIG. 6 is a flowchart illustrating operations of a memory device, according to an exemplary embodiment of the present inventive concept.

Referring to FIG. 6, a reading operation of the memory device, according to an exemplary embodiment of the present inventive concept, may start by allowing a memory controller to obtain a first read voltage from a plurality of memory cells (S10). The memory controller may store the first read voltage to compare the first read voltage with a second read voltage that will be obtained later. In an exemplary embodiment of the present inventive concept, the memory controller may store the first read voltage in a device, such as a capacitor.

Subsequent to obtaining the first read voltage, the memory controller may input a first write current to the memory cells (S11). In an exemplary embodiment of the present inventive concept, the first write current may be a current for phase-changing data storage devices included in the memory cells into an amorphous phase. The memory controller may input the first write current to all of the memory cells, and the first write current may cause the data storage devices of the memory cells to have the amorphous phase. Subsequent to completing the operation (S11) all of the memory cells may have a high resistance value.

The memory controller may obtain the second read voltage from the memory cells (S12). In (S13), the memory controller may compare the second read voltage obtained from each of the memory cells with the first read voltage obtained in operation (S10) and, in (S14), may determine whether a voltage level difference between the first read voltage and the second read voltage for each memory cell is greater than or equal to a reference value.

Based on a result of operation (S14), the memory controller may determine that a reset state exists for a portion of the memory cells whose voltage level differences are lower than the reference value (S15). Based on a result of operation (S14), the memory controller may determine that a set state exists for a portion of the memory cells whose voltage level differences are greater than or equal to the reference value (S16).

The states of the memory cells may be any one of the set state and the reset state, and the memory controller may compare read voltages of the memory cells with a reference voltage level to determine the state of each of the memory cells. For example, the memory controller may determine that the reset state exists for a portion of the memory cells having the read voltages higher than the reference voltage, and may determine that the set state exits for a portion of the memory cells having the read voltages lower than the reference voltage.

In the reading operation, according to an exemplary embodiment of the present inventive concept, the memory controller may sequentially detect the first read voltage and the second read voltage, and may input the first write current to the memory cells, prior to detecting the second read voltage, to set the states of all of the memory cells to the reset state. Thus, a portion of the memory cells, which were in the reset state prior to being input with the first write current, may be have the first read voltage and the second read voltage higher than the reference voltage. A portion of the memory cells, which were in the set state prior to being input with the first write current, may be have the first read voltage lower than the reference voltage and the second read voltage higher than the reference voltage. Thus, the memory controller may determine that a memory cell is in the set state when the difference in levels between its first read voltage and its second read voltage is higher than the reference value, and may determine that a memory cell is in the reset state when the difference in levels between its first read voltage and its second read voltage is lower than the reference value.

In (S17), the memory controller may input a second write current to the portion of the memory cells determined to be in the set state in operation (S16). The second write current may be applied to return the portion of the memory cells that were changed from the set state to the reset state by the first write current back to the set state. In (S18), the memory controller may output data read from the memory cells, using the states of the memory cells determined in the operations (S15, S16). In an exemplary embodiment of the present inventive concept, operation (S17) and operation (S18) may be simultaneously performed, or the order thereof may be changed.

FIGS. 7A, 7B, 7C, 8A, 8B, 8C, 9A, 9B, 9C, 10A, 10B, and 10C are graphs illustrating operations of a memory device, according to an exemplary embodiment of the present inventive concept.

FIGS. 7A, 7B, 7C, 8A, 8B, and 8C are graphs illustrating exemplary embodiments of a reading operation in which data is read from memory cells in a set state. FIGS. 9A, 9B, 9C, 10A, 10B, and 10C are graphs illustrating exemplary embodiments of a reading operation in which data is read from memory cells in a reset state.

Figure 7A:
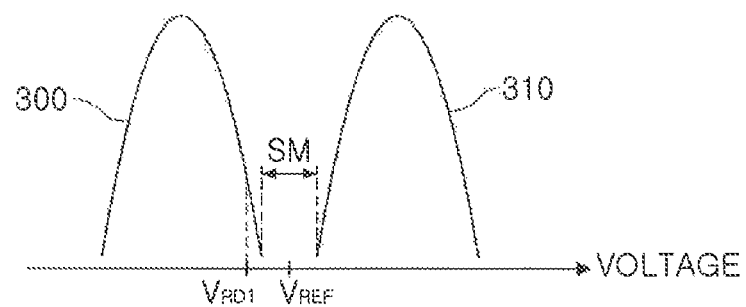
FIGS. 7A, 7B, 7C, 8A, 8B, 8C, 9A, 9B, 9C, 10A, 10B, and 10C are graphs illustrating operations of a memory device, according to an exemplary embodiment of the present inventive concept.

Referring to FIG. 7A, a set read voltage distribution 300 indicating the read voltage distribution of the portion of the memory cells in the set state, and a reset read voltage distribution 310 indicating the read voltage distribution of the portion of the memory cells in the reset state, are illustrated. A sensing margin SM may be present between the set read voltage distribution 300 and the reset read voltage distribution 310, and a reference voltage $V_{REF}$ may be within the sensing margin SM. A read circuit of the memory controller may determine a read voltage read from each of the memory cells with the reference voltage $V_{REF}$ to determine a state of each memory cell as an one of the set state and the reset state.

Referring to FIG. 7A, the memory controller may obtain a first read voltage $V_{RD1}$ from the memory cell. Subsequent to obtaining the first read voltage $V_{RD1}$, the memory controller may input a first write current to the memory cells. As described above, the first write current may be a current for phase-changing data storage devices included in the memory cells into an amorphous phase. Thus, subsequent to inputting the first write current, the read voltage distribution of the memory cells may be represented as illustrated in FIG. 7B.

Figure 7B:
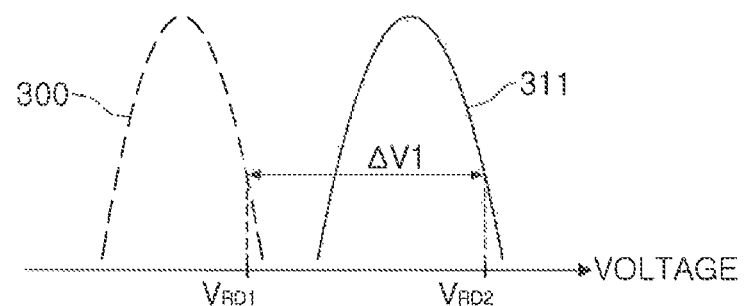
Figure 7C:
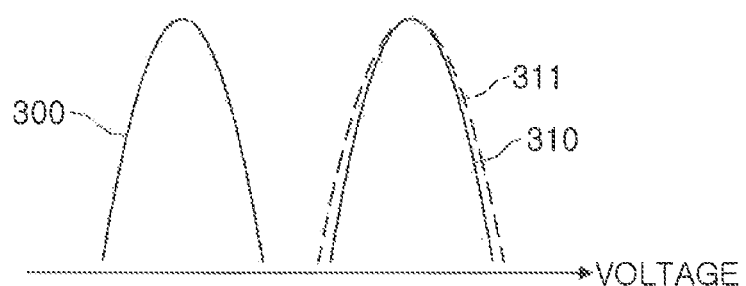

Referring to FIG. 7B, all of the memory cells may be set to the reset state by the first write current, and only a reset read voltage distribution 311 may be represented. Thus, when the reading operation is repeatedly performed on the memory cell from which the first read voltage $V_{RD1}$ has been detected, a second read voltage $V_{RD2}$, other than the first read voltage $V_{RD1}$, may be detected from the memory cell. In the exemplary embodiment illustrated in FIG. 7B, a difference in levels between the first read voltage $V_{RD1}$ and the second read voltage $V_{RD1}$ may be $\Delta V1$.

The memory controller may compare $\Delta V1$, the difference in levels between the first read voltage $V_{RD1}$ and the second read voltage $V_{RD2}$, with a reference value. In an exemplary embodiment of the present inventive concept, the reference value may be less than $\Delta V1$, and thus, the memory controller may determine a state of a corresponding memory cell as the set state. The memory controller may input a second write current to the portion of the memory cells determined to be in the set state, in order to restore the states of the memory cells that were changed by the first write current. Subsequent to inputting the second write current, the read voltage distribution of the memory cells may be represented as illustrated in 7C.

The second write current may be a current for phase-changing the data storage devices included in the memory cells into a crystalline phase. The memory controller may input the second write current to only the portion of the memory cells determined to be in the set state, and thus, restore the states of the memory cells to substantially the same states they were in, prior to the reading operation.

Figure 8A:
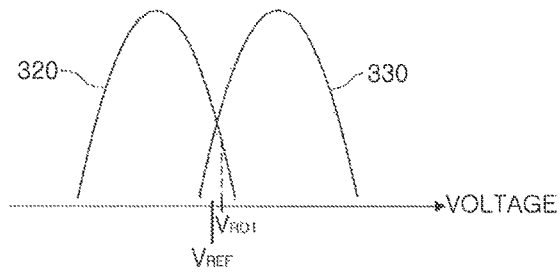

Referring to FIG. 8A, a set read voltage distribution 320 indicating the read voltage distribution of a portion of the memory cells in the set state, and a reset read voltage distribution 330 indicating the read voltage distribution of a portion of the memory cells in the reset state, are illustrated. In the exemplary embodiment illustrated in FIG. 8A, the set read voltage distribution 320 and the reset read voltage distribution 330 may overlap. Thus, when a read voltage of a particular memory cell is in the overlap region between the set read voltage distribution 320 and the reset read voltage distribution 330, the memory controller may not correctly determine a state of the particular memory cell. In the exemplary embodiment illustrated in FIG. 8A, when a read voltage detected from a memory cell is a first read voltage $V_{RD1}$, since the first read voltage $V_{RD1}$ is higher than a reference voltage $V_{REF}$, the memory controller may erroneously determine a state of the memory cell as the reset state.

In an exemplary embodiment of the present inventive concept, the erroneous state determination may not occur since a write current is input in the reading operation and read voltages detected before and after the inputting of the write current are compared with each other. For example, the memory controller of the memory device, according to an exemplary embodiment of the present inventive concept, may detect the first read voltage $V_{RD1}$, and then, may input the first write current to the memory cells. The first write current may be a current for phase-changing data storage devices included in the memory cells into an amorphous phase. In an exemplary embodiment of the present inventive concept, the memory controller may input the first write current to all of the memory cells.

Figure 8B:
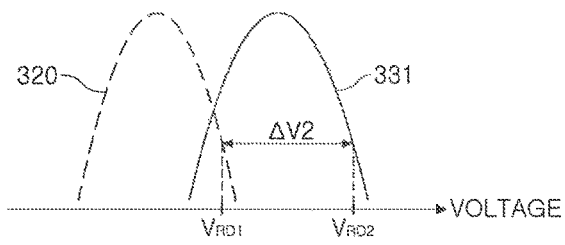

Since the states of all of the memory cells are set as the reset state by the first write current, the read voltage distribution of the memory cells, subsequent to inputting the first write current, may be represented as illustrated in FIG. 8B. Referring to FIG. 8B, only a reset read voltage distribution 331 may be represented. Thus, when a reading operation is repeatedly performed on the memory cell from which the first read voltage $t_{RD1}$ has been detected, a second read voltage $V_{RD2}$, other than the first read voltage $V_{RD1}$, may be detected from the memory cell. In the exemplary embodiment illustrated in FIG. 8B, a difference in levels between the first read voltage $V_{RD1}$ and the second read voltage $V_{RD2}$ may be $\Delta V2$.

Figure 8C:
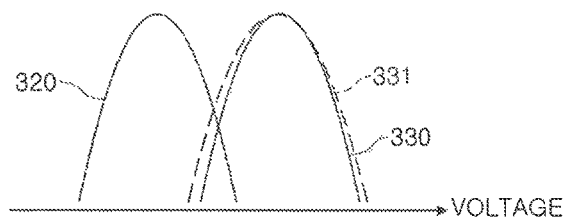

As in the exemplary embodiment illustrated in FIG. 7, the memory controller may compare $\Delta V2$, i.e., the difference in levels between the first read voltage $V_{RD1}$ and the second read voltage $V_{RD2}$, with a reference value. In an exemplary embodiment of the inventive concept, the reference value may be less than $\Delta V1$, and thus, the memory controller may determine a state of the memory cell as the set state. The memory controller may input the second write current to a portion of the memory cells determined to be in the set state, in order to restore the states of the memory cells that were changed by the first write current. Subsequent to inputting the second write current, the read voltage distribution of the memory cells may be represented as illustrated in FIG. 8C.

The second write current may be a current for phase changing data storage devices included in the memory cells into a crystalline phase. The memory controller may input the second write current to only the portion of the memory cells determined to be in the set state, and thus, restore the states of the memory cells to substantially the same states they were in, prior to the reading operation.

Figure 9A:
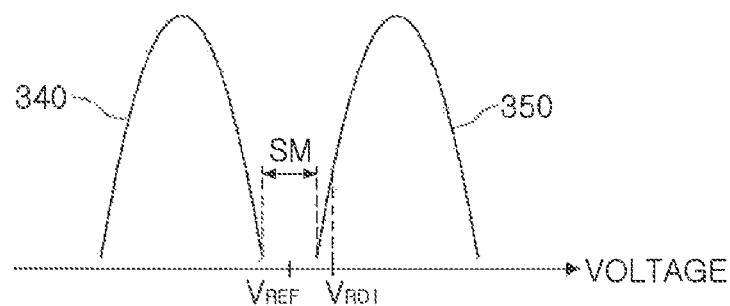

Referring to FIG. 9A, a set read voltage distribution 340 indicating the read voltage distribution of a portion of the memory cells in the set state, and a reset read voltage distribution 350 indicating the read voltage distribution of a portion of the memory cells in the reset state, are illustrated. A sensing margin SM may be present between the set read voltage distribution 340 and the reset read voltage distribution 350, and a reference voltage $V_{REF}$ may be within the sensing margin SM. The read circuit of the memory controller may compare a read voltage read from each of the memory cells with the reference voltage $V_{REF}$ to determine a state of each memory cell as any one of the set state or the reset state.

Figure 9B:
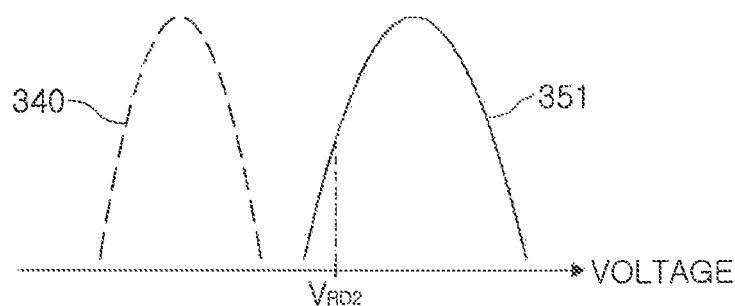

Referring to FIG. 9A, the memory controller may obtain a first read voltage $V_{RD1}$ from a memory cell. Subsequent to obtaining the first read voltage $V_{RD1}$, the memory controller may input a first write current to the memory cells. Subsequent to inputting the first write current, the read voltage distribution of the memory cells may be represented as illustrated in FIG. 9B. The first write current may be a current for phase-changing data storage devices included in the memory cells into an amorphous phase.

Referring to FIG. 9B, all of the memory cells may be set to the reset state by the first write current, and only a reset read voltage distribution 351 may be represented. When a reading operation is repeatedly performed on the memory cell from which the first read voltage $V_{RD1}$ has been detected, a second read voltage $V_{RD2}$ detected from the memory cell may be substantially the same as the first read voltage $V_{RD1}$. This is so, because the state of the memory cell was previously set to the reset state, prior to detecting the first read voltage $V_{RD1}$. Therefore, the memory cell is barely affected by the first write current. Thus, the memory controller may determine that the difference in levels between the first read voltage $V_{RD1}$ and the second read voltage $V_{RD2}$ is less than a reference value. Therefore, the memory controller may determine a state of the memory cell as the reset state.

Figure 9C:
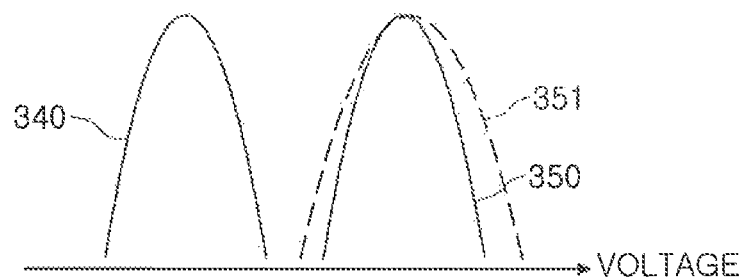

The memory controller may input a second write current to a portion of the memory cells determined to be in the set state, in order to restore the states of the memory cells that were changed by the first write current. Subsequent to inputting the second write current, the read voltage distribution of the memory cells may be represented as illustrated in FIG. 9C. The second write current may be a current for phase-changing data storage devices included in the memory cells into a crystalline phase.

Figure 10A:
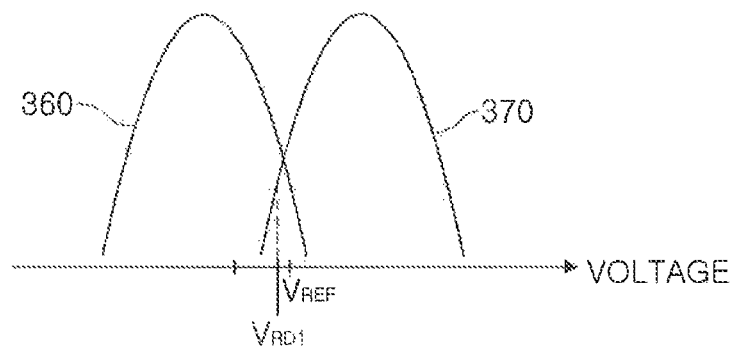

Referring to FIG. 10A, a set read voltage distribution 360 indicating the read voltage distribution of a portion of the memory cells in the set state, and a reset read voltage distribution 370 indicating the read voltage distribution of a portion of the memory cells in the reset state, are illustrated. In the exemplary embodiment illustrated in FIG. 10A, the set read voltage distribution 360 and the reset read voltage distribution 370 may overlap. Thus, when a read voltage of a particular memory cell is detected in the overlap region between the set read voltage distribution 360 and the reset read voltage distribution 370, the memory controller may not correctly determine a state of the particular memory cell. In the exemplary embodiment illustrated in FIG. 10A, when a read voltage detected from a memory cell is a first read voltage $V_{RD1}$, even when the memory cell is in the reset state, the memory controller may erroneously determine a state of the memory cell as the set state.

To not erroneously determine the state of the memory cell as the set state, the memory controller of the memory device, according to an exemplary embodiment of the present inventive concept, may detect the first read voltage $V_{RD1}$, and then, may input a first write current to the memory cells. The first write current may be a current for phase-changing data storage devices included in the memory cells into an amorphous phase. In an exemplary embodiment of the present inventive concept, the memory controller may input the first write current to all of the memory cells.

Figure 10B:
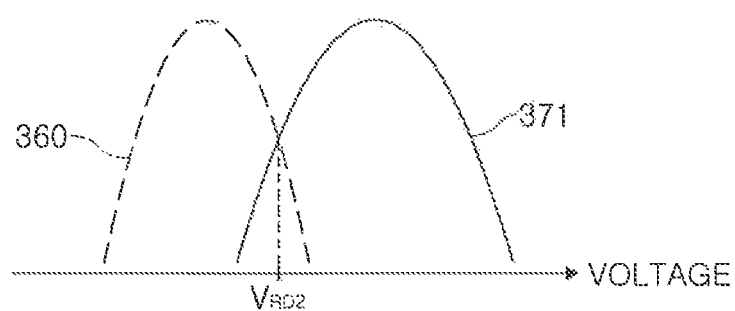

Since the states of all of the memory cells are set to the reset state by the first write current, the read voltage distribution of the memory cells, subsequent to the input of the first write current, may be represented as illustrated in FIG. 10B. Referring to FIG. 10B, only a reset read voltage distribution 371 may be represented. Subsequent to the input of the first write current, when the reading operation is repeatedly performed on the memory cell from which the first read voltage $V_{RD1}$ has been detected, a second read voltage $V_{RD2}$ may be detected from the memory cell. The second read voltage $V_{RD2}$ may be substantially the same as the first read voltage $V_{RD1}$.

The memory controller may calculate a difference in levels between the first read voltage $V_{RD1}$ and the second read voltage $V_{RD2}$, and may compare the difference with a reference value. In an exemplary embodiment of the present inventive concept, since the first read voltage $V_{RD1}$ and the second read voltage $V_{RD2}$ may be substantially the same, the difference therebetween may be lower than the reference value. Thus, the memory controller may determine a state of the memory cell as the reset state.

Figure 10C:
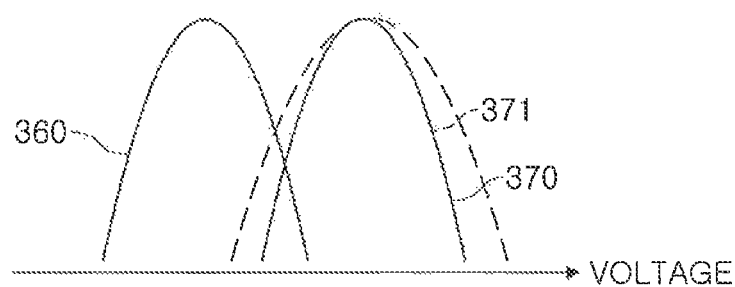

The memory controller may input a second write current to the portion of the memory cells determined to be in the set state, in order to restore the states of the memory cells that were changed by the first write current. Subsequent to inputting the second write current, the read voltage distribution of the memory cells may be restored as illustrated in FIG. 10C. In other words, the reset read voltage distribution 371 may be restored to 370.

Figure 11:
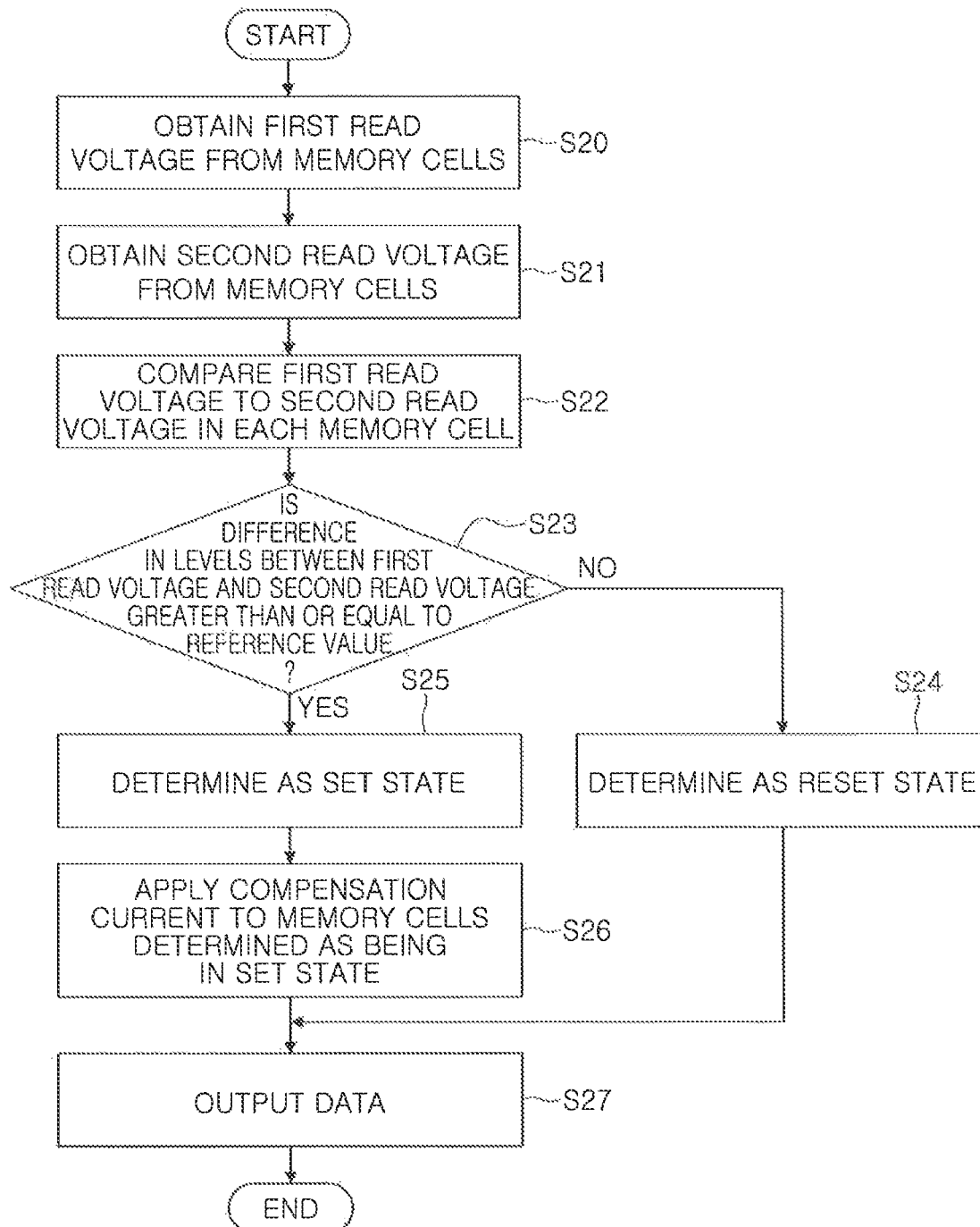
FIG. 11 is a flowchart illustrating operations of a memory device, according to an exemplary embodiment of the present inventive concept.

FIG. 11 is a flowchart illustrating operations of a memory device, according to an exemplary embodiment of the present inventive concept.

Referring to FIG. 11, a reading operation of the memory device, according to an exemplary embodiment of the present inventive concept, may start by allowing a memory controller to obtain a first read voltage from a plurality of memory cells (S20). The memory controller may supply a read current to each of the memory cells to obtain the first read voltage. Subsequent to obtaining the first read voltage, the memory controller may repeatedly input a read current to the memory cells to obtain a second read voltage (S21).

In (S22), the memory controller may compare the first read voltage obtained in the operation (S20) with the second read voltage obtained in the operation (S21). The memory controller may determine whether a difference in levels between the first read voltage and the second read voltage is greater than or equal to a reference value (S23).

Based on a result of the determination in operation (S23), the memory controller may determine that a reset state exists for a portion of the memory cells whose voltage level differences are lower than the reference value (S24). Based on a result of the determination in operation (S23), the memory controller may determine that a set state exists for a portion of the memory cells whose voltage level difference greater than or equal to the reference value (S25).

The memory controller may compare read voltages of the memory cells with a reference voltage level to determine the state of each of the memory cells. For example, the memory controller may determine that a portion of the memory cells having the read voltages higher than the reference voltage has the reset state, and may determine that a portion of the memory cells having the read voltages lower than the reference voltage has the set state.

In an example case, a sensing margin may exist between the read voltage distribution of a portion of the memory cells in the set state and the read voltage distribution of a portion of the memory cells in the reset state. However, the read voltage distribution of the portion of the memory cells in the set state and the read voltage distribution of the portion of the memory cells in the reset state may overlap each other. When a read voltage is present in an overlap region between read voltage distributions in different states, the memory controller may erroneously determine a state of a corresponding memory cell.

To not erroneously determine the state of the memory cell as just discussed, the memory controller may sequentially detect the first read voltage and the second read voltage in the reading operation according to an exemplary embodiment of the present inventive, and may compare the difference in levels between the first read voltage and the second read voltage with the reference value to determine the state of the memory cell. In the case that the memory cell is in the set state, the second read voltage may be detected as being higher than the first read voltage, and in the case that the memory cell is in the reset state, the first read voltage and the second read voltage may have substantially the same value. Thus, the memory device may determine that the memory cell is in the reset state when the difference in levels between the first read voltage and the second read voltage is lower than the reference value, and may determine that the memory cell is in the set state when the difference in levels between the first read voltage and the second read voltage is higher than the reference value.

For the memory controller to correctly determine the state of the memory cell, the reference value may be determined by read disturb properties exhibited by the memory cell in the set state during the reading operation. For example, a phase change due to heat generated from the read current may occur in the data storage element included in the memory cell in the set state during the reading operation. Thus, the read disturb properties may appear, such that a resistance value of the memory cell in the set state may be increased.

In an exemplary embodiment of the present inventive concept, the reference value, which is determined by the read disturb properties, may be proportional to how much the resistance value of the memory cell in the set state increases during the reading operation.

In the process of inputting an input current to each of the memory cells to perform the reading operation, the switch element included in each memory cell may be turned on, and heat generated when the switch element is turned-on may cause the phase change in the data storage device. The phase change of the data storage element may likely happen to the memory cell in the set state. When the read current causes the phase change of the data storage element to occur in the memory cell in the set state, the resistance value of the memory cell in the set state may be increased. Therefore, the sensing margin of the memory device may be reduced.

To prevent the sensing margin from being reduced, the memory device, according to an exemplary embodiment of the present inventive concept, may complete the reading operation and then input a compensation current to the memory cells determined to be in the set state (S26). The compensation current may be a current for setting the states of the memory cells to the set state. The compensation current may restore the phase change that occurred in the data storage element of the memory cell in the set state during the reading operation. In (S27), the memory controller 220 may output data, based on the state of each memory cell determined in the operations S23 through S25. In an exemplary embodiment of the present inventive concept, the compensation current may be applied to the portion of the memory cells in the set state, prior to outputting the data, or may be simultaneously input while the data is outputted.

FIGS. 12A, 12B, 12C, 13A, 13B, and 13C are graphs illustrating operations of a memory device, according to an exemplary embodiment of the present inventive concept.

Figure 12A:
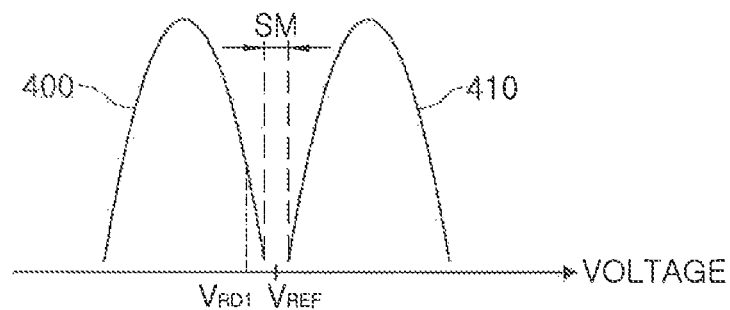
FIGS. 12A, 12B, 12C, 13A, 13B, and 13C are graphs illustrating operations of a memory device, according to an exemplary embodiment of the present inventive concept.

Referring to FIG. 12A, a set read voltage distribution 400 indicating the read voltage distribution of a portion of the memory cells is in the set state, and a reset read voltage distribution 410 indicating the read voltage distribution of a portion of the memory cells is in the reset state, are illustrated. A sensing margin SM may be present between the set read voltage distribution 400 and the reset read voltage distribution 410, and a reference voltage $V_{REF}$ may be within the sensing margin SM. The read circuit of the memory controller may compare a read voltage read from each of the memory cells with the reference voltage $V_{REF}$ to determine a state of each memory cell as any one of the set state or the reset state.

Figure 12B:
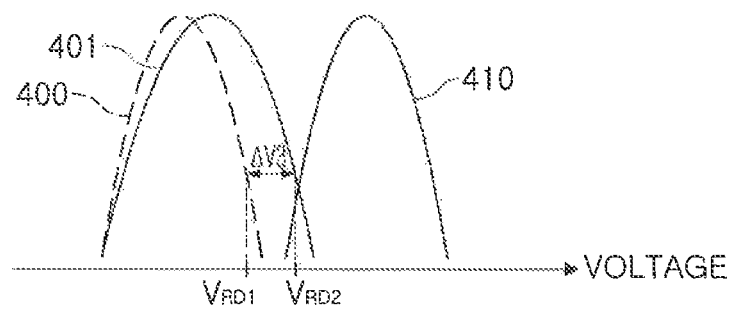

The memory controller may obtain a first read voltage $V_{RD1}$ from a memory cell. A read current applied to the memory cell by the memory controller to obtain the first read voltage $V_{RD1}$ may increase a resistance value of at least a portion of the memory cells in the set state. Referring to FIG. 12B, as the resistance value of the at least a portion of the memory cells in the set state is increased by the read current, a set read voltage distribution 401 may move to the left. In other words, a degree thereof may be increased.

The memory controller may obtain a second read voltage $V_{RD2}$ from the memory cell from which the first read voltage $V_{RD1}$ has been obtained. The second read voltage $V_{RD2}$ may be obtained in a reading operation distinct from that in which the first read voltage $V_{RD1}$ has been obtained. Alternatively, the second read voltage $V_{RD2}$ may be obtained, together with the first read voltage $V_{RD1}$, when the first read voltage $V_{RD1}$ is obtained. In the exemplary embodiment illustrated in FIG. 12B, a difference in levels between the first read voltage $V_{RD1}$ and the second read voltage $V_{RD2}$ may be $\Delta V3$.

Figure 12C:
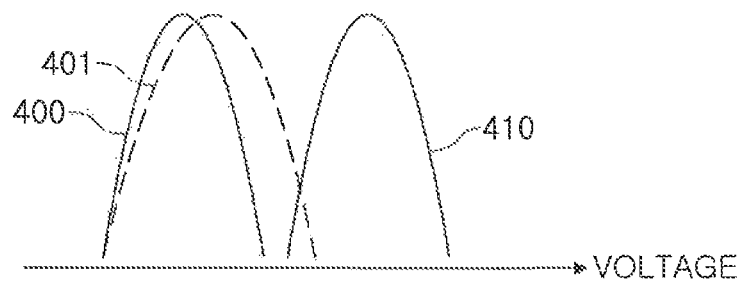

The memory controller may compare $\Delta V3$, i.e., the difference in levels between the first read voltage $V_{RD1}$ and the second read voltage $V_{RD2}$, with a reference value. In an exemplary embodiment of the present inventive concept, the reference value may be less than $\Delta V3$, and thus, the memory controller may determine a state of a corresponding memory cell as the set state. Subsequent to obtaining the second read voltage $V_{RD2}$, the memory controller may input a compensation current to restore an increase in a resistance value of a portion of the memory cells due to the reading operation. As illustrated in FIG. 12C, subsequent to inputting the compensation current, the read voltage distribution of the memory cells may be substantially the same as shown in FIG. 12A prior to the reading operation. For example, the memory controller may selectively input the compensation current to only a portion of the memory cells determined to be in the set state to reduce power consumption.

Figure 13A:
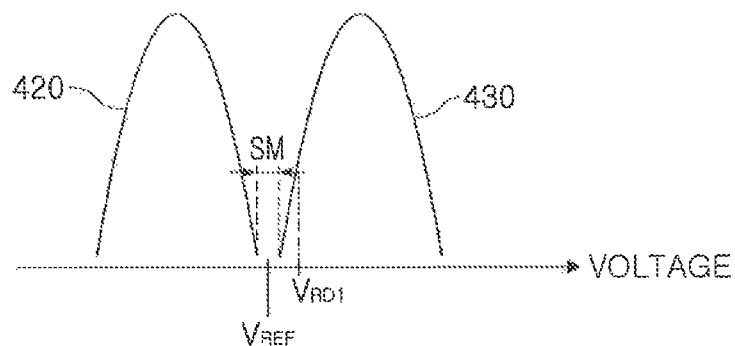

Referring to FIG. 13A, a set read voltage distribution 420 indicating the read voltage distribution of a portion of the memory cells is in the set state, and a reset read voltage distribution 430 indicating the read voltage distribution of a portion of the memory cells is in the reset state, are illustrated. A sensing margin SM may be present between the set read voltage distribution 420 and the reset read voltage distribution 430, and a reference voltage $V_{REF}$ may be within the sensing margin SM.

Figure 13B:
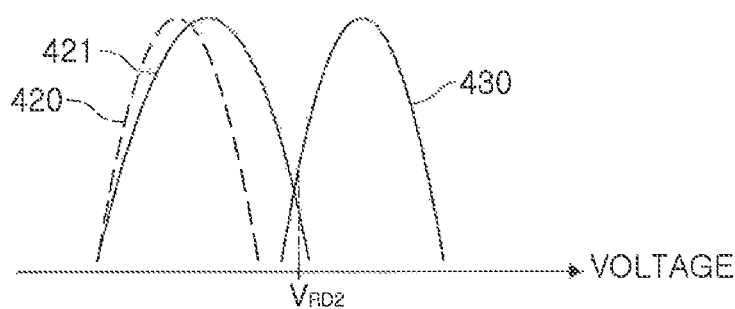

The memory controller may obtain a first read voltage $V_{RD1}$ from a memory cell. A read current applied to the memory cell by the memory controller to obtain the first read voltage $V_{RD1}$ may increase a resistance value of at least a portion of the memory cells in the set state. Referring to FIG. 13B, as the resistance value of the at least a portion of the memory cells in the set state is increased by the read current, an intermediate value of a set read voltage distribution 421 may move to the left. In other words, a degree thereof may be increased.

The memory controller may obtain a second read voltage $V_{RD2}$ from the memory cell from which the first read voltage $V_{RD1}$ has been obtained. The second read voltage $V_{RD2}$ may be obtained in a reading operation distinct from that in which the first read voltage $V_{RD1}$ has been obtained. Alternatively, the second read voltage $V_{RD2}$ may be obtained, together with the first read voltage $V_{RD1}$, in the reading operation in which the first read voltage $V_{RD1}$ has been obtained. In an exemplary embodiment of the present inventive concept illustrated in FIG. 13B, the memory cell from which the memory controller obtained the first read voltage $V_{RD1}$ may be a memory cell in the reset state, and the second read voltage $V_{RD2}$ may be substantially the same as the first read voltage $V_{RD1}$. This is so, because the phase change of the data storage element due to the reading operation is less likely to occur in the portion of the memory cells in the reset state.

The memory controller may compare a difference in levels between the first read voltage $V_{RD1}$ and the second read voltage $V_{RD2}$ with a reference value. In the exemplary embodiment illustrated in FIG. 13B, since the first read voltage $V_{RD1}$ and the second read voltage $V_{RD2}$ are substantially the same, the difference in levels between the first read voltage $V_{RD1}$ and the second read voltage $V_{RD2}$ may be lower than the reference value. Thus, the memory controller may determine a state of a corresponding memory cell as the reset state.

Figure 13C:
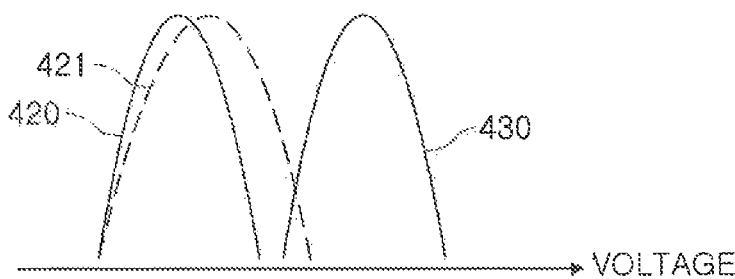

Subsequent to obtaining the second read voltage $V_{RD2}$, the memory controller may input a compensation current to restore an increase in a resistance value of a portion of the memory cells due to the reading operation. As illustrated in FIG. 13C, subsequent to inputting the compensation current, the read voltage distribution of the memory cells may be substantially the same as that shown in FIG. 13A, prior to the reading operation. In other words, the set read voltage distribution 420 in FIGS. 13A and 13C may be the same as each other.

Figure 14:
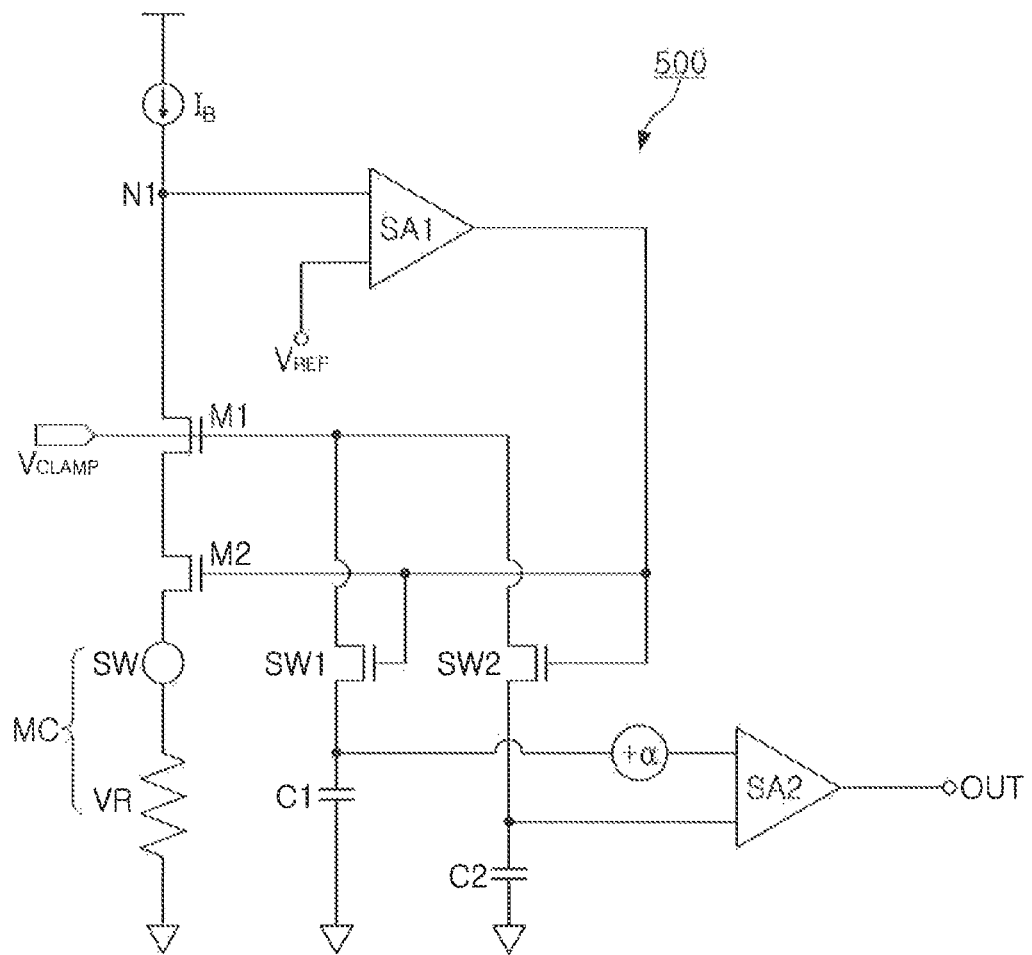
FIGS. 14, 15, and 16 are circuit diagrams illustrating a circuit for reading data stored on a memory cell, according to an exemplary embodiment of the present inventive concept.
Figure 15:
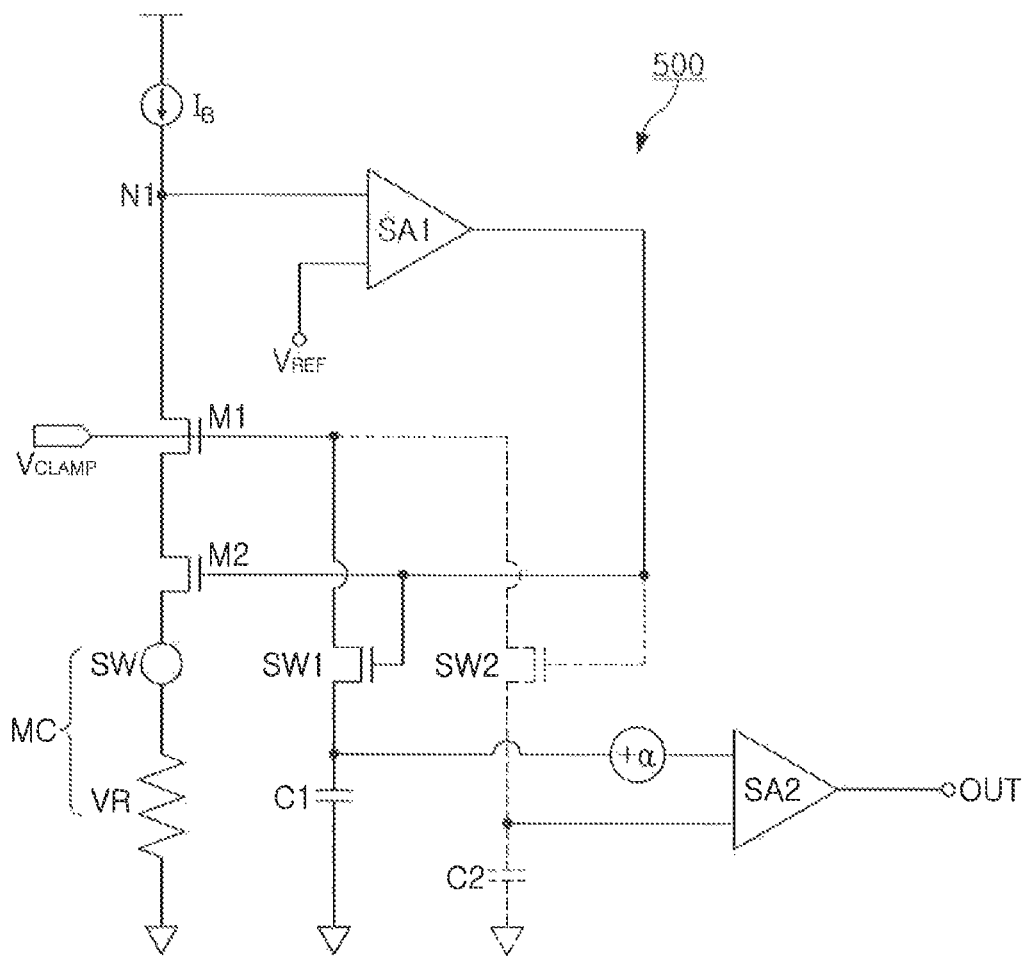
Figure 16:
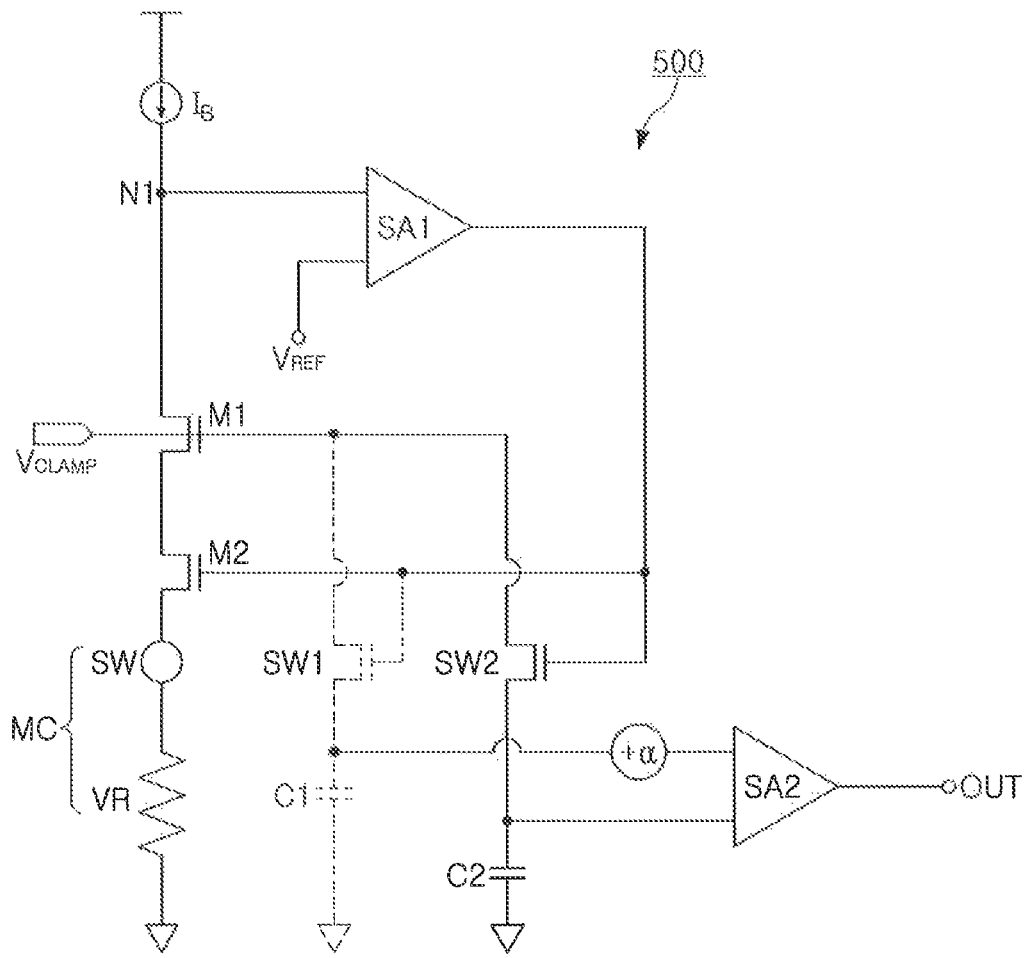

FIGS. 14, 15, and 16 are circuit diagrams illustrating a circuit for reading data stored on a memory cell, according to an exemplary embodiment of the present inventive concept.

Referring to FIG. 14, a memory cell MC may include a switch element SW and a data storage element VR. The switch element SW may be an OTS device, and the data storage element VR may be a variable resistor including a phase-change material. In an exemplary embodiment of the present inventive concept, the phase-change material included in the data storage element VR may include GST or the like.

A read circuit 500 may supply a level of bias current $I_B$ to the memory cell MC to read data stored in the memory cell MC. In an exemplary embodiment of the present inventive concept, the bias current $I_B$ may be supplied to the memory cell MC through clamping transistors M1 and M2. The clamping transistors M1 and M2 may be operated by a clamping voltage $V_{CLAMP}$ input to a gate terminal, and a voltage of a first node N1 may be clamped by the clamping transistors M1 and M2 to be within a particular range. The clamping voltage $V_{CLAMP}$ may have ramp voltage characteristics. In an exemplary embodiment of the present inventive concept, the voltage of the first node N1 may be clamped to have a magnitude lower than a threshold voltage of the phase-change material included in the data storage element VR.

Each of a first capacitor C1 and the second capacitor C2 may store a first read voltage and a second read voltage detected from the memory cell MC. In an exemplary embodiment of the present inventive concept, when the clamping voltage $V_{CLAMP}$ is higher than the threshold voltage of the switch element SW, a first sense amplifier SA1 may turn off a first switch SW1 or a second switch SW2, and the first read voltage and the second read voltage may be stored in the first capacitor C1 and the second capacitor C2, respectively. A second sense amplifier SA2 may compare the first read voltage and the second read voltage stored in the first capacitor C1 and the second capacitor C2, respectively.

In an exemplary embodiment of the present inventive concept, the second sense amplifier SA2 may add an offset value α to the first read voltage, and may compare the first read voltage with the second read voltage. According to an exemplary embodiment of the present inventive concept, the offset value α may also be added to the second read voltage. The offset value α may be determined, depending on how much a resistance value of the memory cell in a set state increases during a reading operation, in order for the memory controller to correctly determine a state of the memory cell MC. For example, when the resistance value of the memory cell in the set state significantly increases during the reading operation, the offset value α may be relatively large. In contrast, when the resistance value of the memory cell in the set state increases by a small amount during the reading operation, the offset value α may be relatively small.

Operations of the read circuit 500 will be described hereinafter in more detail, with reference to FIGS. 15 and 16.

FIG. 15 is a circuit diagram illustrating the operations of the read circuit 500 when the first read voltage is detected. Referring to FIG. 15, when the first read voltage is detected, the second switch SW2 may not be operated. When the clamping voltage $V_{CLAMP}$ is applied to detect the first read voltage, the first switch SW1 may be turned on, so that the first capacitor C1 may be charged.

When an increase in the clamping voltage $V_{CLAMP}$ causes the switch element SW of the memory cell MC to be turned on, the first sense amplifier SA1 may turn off the first switch SW1 to complete the charging of the first capacitor C1. When the voltage of the first node N1 is higher than the reference voltage $V_{REF}$, the first sense amplifier SA1 may turn off the first switch SW1.

FIG. 16 is a circuit diagram illustrating the operations of the read circuit 500 when the second read voltage is detected. Referring to FIG. 16, when the second read voltage is detected, the first switch SW1 may not be operated. When the clamping voltage $V_{CLAMP}$ is applied to detect the second read voltage, the second switch SW2 may be turned on, so that the second capacitor C2 may be charged. When an increase in the clamping $V_{CLAMP}$ causes the switch element SW of the memory cell MC to be turned on, the first sense amplifier SA1 may turn off the second switch SW2 to complete the charging of the second capacitor C2.

The second sense amplifier SA2 may compare the first read voltage and the second read voltage stored in the first capacitor C1 and the second capacitor C2, respectively. As described above, the second sense amplifier SA2 may add an offset value α to the first read voltage or the second read voltage. When the offset value α is added to the first read voltage, the memory controller may determine the state of the memory cell MC as any one of the set state or the reset state. This is illustrated by Formula 1 below, for example.

Formula 1

First read voltage+α<Second read voltage->Determine as set state

First read voltage+α>Second read voltage->Determine as reset state

In an exemplary embodiment of the present inventive concept, in order to read data stored in the memory cell MC, the memory controller may sequentially obtain the first read voltage and the second read voltage from the memory cell MC and compare the first read voltage with the second read voltage to determine the state of the memory cell MC as any one of the set state of the reset state. Thus, even when the resistance values of the memory cells in the set state increase, or the read voltage distributions of the memory cells in the set state and the memory cells in the reset state overlap each other during the reading operation, the memory controller may correctly road the data stored on the memory cell MC. As described above, a write current may also be applied to the memory cell MC, subsequent to obtaining the first read voltage, and prior to obtaining the second read voltage.

Figure 17A:
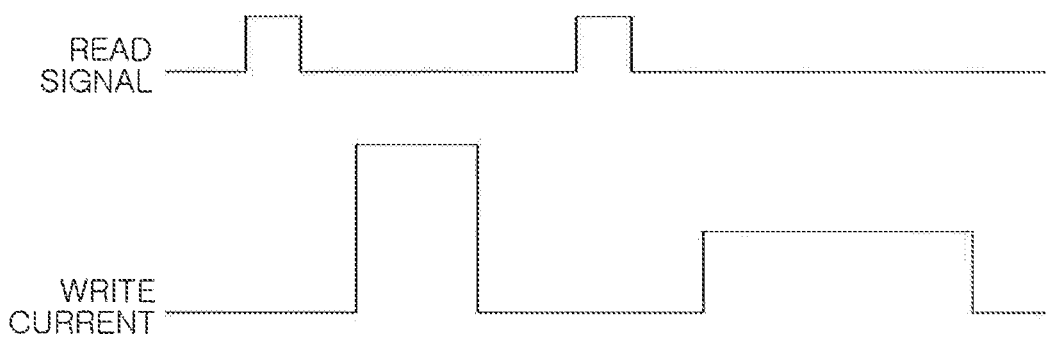
FIGS. 17A and 17B are timing diagrams illustrating operations of a memory device, according to an exemplary embodiment of the present inventive concept.
Figure 17B:
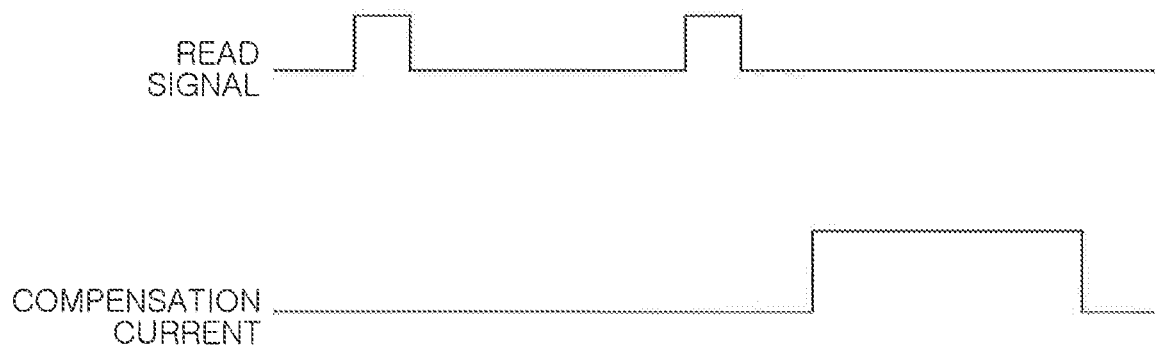

FIGS. 17A and 17B are timing diagrams illustrating operations of a memory device, according to an exemplary embodiment of the present inventive concept.

Referring to FIG. 17A, the memory controller may sequentially input a read signal to a memory cell twice. The memory controller may obtain a first read voltage in a first reading operation in which a first read signal is input, and may obtain a second read voltage in a second reading operation which a second read signal is input.

In an exemplary embodiment illustrated in FIG. 17A, the memory controller may input a first write current to memory cells, prior to inputting the second read signal. In an exemplary embodiment of the present inventive concept, the first write current may be applied to all of the memory cells, and may be a current for setting a state of the memory cell to the reset state. The first write current may set all of the memory cells to the reset state.

A portion of the memory cells, which are in the set state prior to the first reading operation, may be changed to the reset state. A portion of the memory cells, which are in the reset state prior to the first reading operation, may be maintained in the reset state, regardless of the first write current. Thus, the memory controller may determine that a portion of the memory cells is in the set state, when those memory cells have a difference in levels between the first read voltage and the second read voltage higher than a reference value. The memory controller may selectively input a second write current to only the portion of the memory cells that were determined as being in the set state, subsequent to completing the second reading operation, in order to restore the state change of those memory cells due to the first write current. The second write current may be a current for setting the state of the memory cell as the set state.

Referring to FIG. 17B, the memory controller may sequentially input the read signal to the memory cell twice. The memory controller may obtain the first read voltage in the first reading operation in which the first read signal is input, and may obtain the second read voltage in the second reading operation in which the second read signal is input. In an exemplary embodiment of the present inventive concept, the memory controller may also sequentially obtain the first read voltage and the second read voltage during a one-time reading operation.

A resistance value of the portion of the memory cells, which are in the set state prior to the first reading operation, may increase during the first reading operation. A resistance value of the portion of the memory cells, which are in the reset state prior to the first reading operation, may barely change during the first reading operation. Thus, the memory device may determine that the portion of the memory cells having the difference in levels between the first read voltage and the second read voltage higher than the reference value is in the set state, and may determine that a portion of the memory cells having the difference in levels between the first read voltage and the second read voltage lower than the reference value is in the reset state.

The memory controller may selectively input a compensation current to only the portion of the memory cells determined to be in the set state, subsequent to completing the second reading operation. This may be done to compensate for the increase in the resistance value of the portion of the memory cells being in the set state due to the reading operation. The compensation current may be a set write current for setting the state of the memory cell as the set state.

Figure 18:
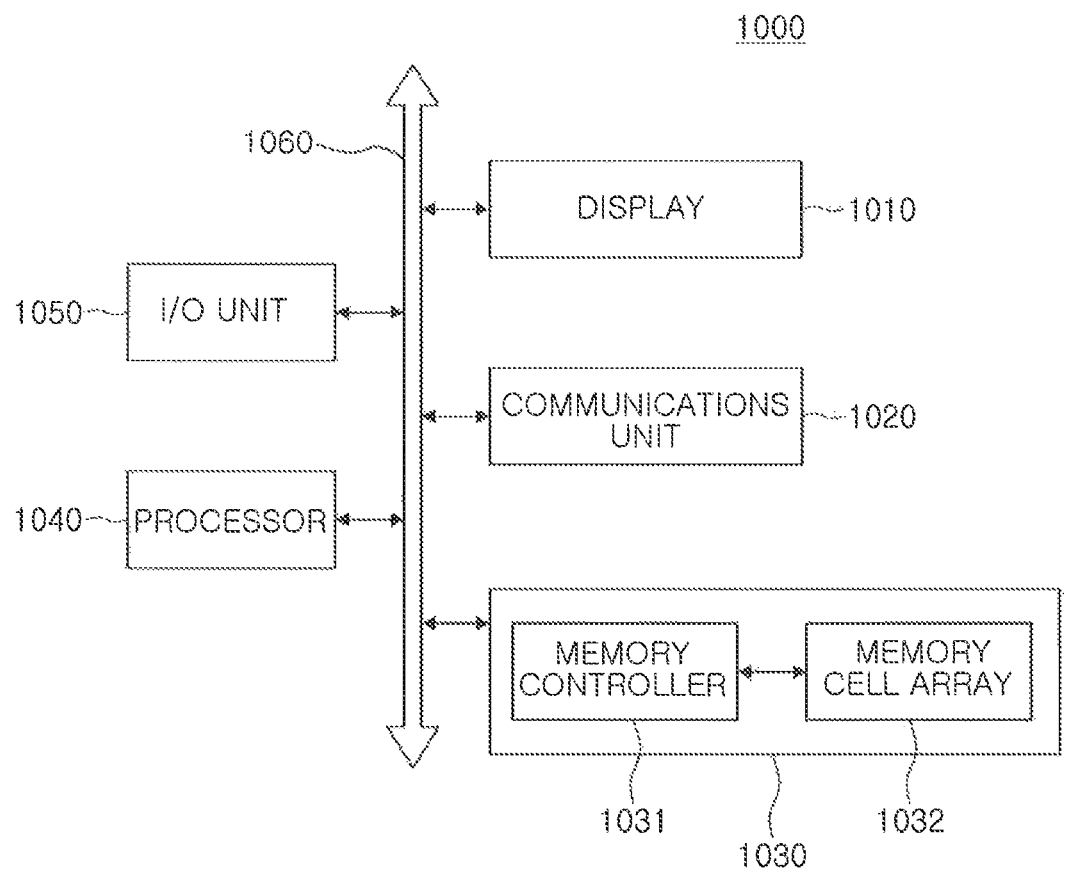
FIG. 18 is a block diagram schematically illustrating an electronic device including a memory device, according to an exemplary embodiment of the present inventive concept.

FIG. 18 is a block diagram schematically illustrating an electronic device including a memory device, according to an exemplary embodiment of the present inventive concept.

An electronic device 1000, according to the exemplary embodiment illustrated in FIG. 18, may include a display 1010, a communications unit 1020, a memory device 1030, a processor 1040, and an input/output (I/O) unit 1050. Components, such as the display 1010, the communications unit 1020, the memory device 1030, the processor 1040, and the I/O unit 1050, may communicate with each other through a bus 1060. In addition to the foregoing components, the electronic device 1000 may further include a power supply device and a port.

The processor 1040 may perform specific arithmetic operations, instructions, or tasks. The processor 1040 may be a central processing unit (CPU), a micro controller unit (MCU), or an application processor (AP), and may communicate with the other components, such as the display 1010, the communications unit 1020, the memory device 1030, and the I/O unit 1050.

The memory device 1030 included in the electronic device 1000 illustrated in FIG. 18 may be the memory device, according to various exemplary embodiments of the present inventive concept. For example, the memory device 1030 may include a memory controller 1031 and a memory cell array 1032, and may operate according to the various exemplary embodiments described above with reference to FIGS. 1 through 17. The memory device 1030 may store, output, or delete data, in response to an instruction received from the processor 1040.

As set forth above, according to exemplary embodiments of the present inventive concept, a memory device may detect a read voltage multiple times from a memory cell from which data is to be read, according to resistance changes that may occur in the memory cell, due to a read operation, and may compare the detected read voltages to each other to determine data stored in the memory cell. Thus, the memory device may prevent a sensing margin of the memory cell from being reduced as a level of resistance applied to the data storage element of the memory cell, during the read operation, changes. Therefore, the operating properties of the memory device may be increased.

While the present inventive concept has been particularly shown and described with reference to exemplary embodiments thereof, it will be apparent to those skilled in the art that modifications and variations could be made thereto without departing from the scope of the present inventive concept, as defined by the appended claims.

What is claimed is:

1. A memory device, comprising:
a memory cell array comprising a plurality of memory cells, each of the plurality of memory cells having a switch element, and a data storage element connected to the switch element and containing a phase-change material; and
a memory controller for inputting a read current to the plurality of memory cells, sequentially detecting first read voltages and second read voltages from the plurality of memory cells, and comparing the first read voltage of a first memory cell of the plurality of memory cells to the second read voltage of the first memory cell to determine a state of the first memory cell,
wherein the memory controller adds an offset voltage to the first read voltage of the first memory cell, and compares the first read voltage with the offset voltage added thereto to the second read voltage to determine if the first memory cell is in a set state or a reset state.

2. The memory device of 1, wherein a magnitude of the offset voltage is determined by a read disturb property of the first memory cell.

3. The memory device of claim 1 wherein, when a sum of the first read voltage and the offset voltage is less than the second read voltage, the memory controller determines the state of the first memory cell to be the set state.

4. The memory device of claim 1, wherein, when a sum of the first read voltage and the offset voltage is greater than the second read voltage, the memory controller determines the state of the first memory cell to be the reset state.

5. A memory device, comprising:
a memory cell array comprising a plurality of memory cells, each of the plurality of memory cells having a switch element and a data storage element connected to the switch element and containing a phase-change material; and
a memory controller for inputting a read current to the plurality of memory cells, sequentially detecting first read voltages and second read voltages from the plurality of memory cells, and comparing the first read voltage of a first memory cell of the plurality of memory cells to the second read voltage of the first memory cell to determine a state of the first memory cell,
wherein after the memory controller detects the second read voltage, the memory controller inputs a write current for setting the state of the first memory cell as a set state to the first memory cell when the first memory cell is determined to be in the set state.

6. The memory device of claim 1, wherein the read current flows from the switch element to the data storage element in each of the plurality of memory cells.

7. A memory device, comprising:
a memory cell having a switch element, and a data storage element connected to the switch element and containing a phase-change material; and
a memory controller for sequentially detecting a first read voltage and a second read voltage from the memory cell, and comparing the first read voltage to the second read voltage to determine a state of the memory cell as a set state or a reset state,
wherein, when the state of the memory cell is determined as the set state, the memory controller inputs, to the memory cell, a set write current for setting the state of the memory cell as the set state.

8. The memory device of claim 7, wherein after the memory controller detects the first read voltage from the memory cell, the memory controller inputs a reset write current for setting the state of the memory cell as the reset state to the memory cell, and then, detects the second read voltage.

9. The memory device of claim 7, wherein, when a difference between the first read voltage and the second read voltage is higher than a reference value, the memory controller determines the state of the memory cell as the set state, and, when the difference between the first read voltage and the second read voltage is lower than the reference value, the memory controller determines the state of the memory cell as the reset state.

10. The memory device of claim 9, wherein the reference value is determined by a resistance property of the data storage element and a read disturb property of the memory cell.

11. The memory device of claim 1, wherein after the memory controller detects the second read voltage, the memory controller inputs a write current for setting the state of the first memory cell as a set state to the first memory cell when the first memory cell is determined to be in the set state.

\* \* \* \* \*